(12) United States Patent
Zhang et al.

(10) Patent No.: US 7,630,997 B2
(45) Date of Patent: Dec. 8, 2009

(54) SYSTEMS AND METHODS FOR EFFICIENTLY COMPRESSING AND DECOMPRESSING MARKUP LANGUAGE

(75) Inventors: Qian Zhang, Beijing (CN); Yunxin Liu, Beijing (CN)

(73) Assignee: Microsoft Corporation, Redmond, WA (US)

( * ) Notice: Subject to any disclaimer, the term of this patent is extended or adjusted under 35 U.S.C. 154(b) by 327 days.

(21) Appl. No.: 11/089,193

(22) Filed: Mar. 23, 2005

(65) Prior Publication Data
US 2006/0218161 A1 Sep. 28, 2006

(51) Int. Cl.
*G06F 7/00* (2006.01)

(52) U.S. Cl. ............... 707/101; 707/100; 717/136; 717/143

(58) Field of Classification Search ......... 707/100; 715/500; 717/143
See application file for complete search history.

(56) References Cited

U.S. PATENT DOCUMENTS

| | | | | |
|---|---|---|---|---|
| 6,081,212 | A * | 6/2000 | Tagato et al. ............... 341/79 |
| 7,119,577 | B2 * | 10/2006 | Sharangpani ............... 326/46 |
| 7,131,077 | B1 * | 10/2006 | James-Roxby et al. ......... 716/3 |
| 7,257,575 | B1 * | 8/2007 | Johnston et al. ............... 707/4 |
| 2002/0064267 | A1 * | 5/2002 | Martin et al. ......... 379/201.01 |
| 2003/0041077 | A1 * | 2/2003 | Davis et al. ................. 707/500 |
| 2003/0158854 | A1 * | 8/2003 | Yoshida et al. .............. 707/101 |
| 2004/0003343 | A1 | 1/2004 | Liao et al. .................... 715/513 |
| 2004/0215595 | A1 * | 10/2004 | Bax ............................ 707/1 |
| 2005/0228791 | A1 * | 10/2005 | Thusoo et al. ................. 707/6 |
| 2005/0228792 | A1 * | 10/2005 | Chandrasekaran et al. ..... 707/9 |
| 2006/0117307 | A1 * | 6/2006 | Averbuch et al. ............ 717/143 |
| 2006/0150168 | A1 * | 7/2006 | Mitchell et al. ............. 717/156 |
| 2006/0253465 | A1 * | 11/2006 | Willis et al. ................. 707/100 |
| 2007/0273564 | A1 * | 11/2007 | Morel ......................... 341/87 |

OTHER PUBLICATIONS

Sundaresan, Neel et al., "Algorithms And Programming Models For Effiecient Representation Of XML For Internet Applications", Hong Kong, May 2001, pp. 366-375 (ACM 1-58113-348-0).*

* cited by examiner

*Primary Examiner*—Pierre M Vital
*Assistant Examiner*—Christopher J Raab
(74) *Attorney, Agent, or Firm*—Woodcock Washburn LLP

(57) ABSTRACT

Systems and methods for compressing markup language data, such as XML data, are provided that utilize a finite state machine (FSM), which is representative of an XML schema, and a rule file. Information defined in an XML schema is abstracted into a finite state machine (FSM). The rule file ensures that a compressor and de-compressor have consistent FSMs when the compressor and de-compressor for XML data are not in the same location, such as is generally the case for Web Services scenarios or other client/server scenarios. With the rule file, FSMs can thus be be easily stored, transmitted and updated.

20 Claims, 15 Drawing Sheets

```
<xsd:schema xmlns:xsd='http://www.w3.org/2001/XMLSchema' xmlns='http://
www.samplenamespace.com' targetNamespace='http://www.samplenamespace.com'>
 <xsd:element name='A' type='xsd:string' nillable='true' />
 <xsd:element name='B' type='xsd:string'/>
 <xsd:element name='C' type='xsd:string'/>
 <xsd:element name='D' type='typeD'/>
 <xsd:complexType name='typeD'>
  <xsd:sequence>
   <xsd:any namespace="##other" />
  </xsd:sequence>
 </xsd:complexType>
 <xsd:element name='E' type='typeE'/>
 <xsd:complexType name='typeE'>
  <xsd:sequence>
   <xsd:element ref='A' />
   <xsd:element ref='B' />
  </xsd:sequence>
  <xsd:attribute name='orderDate' type='xsd:date' form='qualified' />
 </xsd:complexType>
 <xsd:element name='F' type='typeF'/>
 <xsd:complexType name='typeF'>
  <xsd:choice>
   <xsd:element ref='C' />
   <xsd:element name='G' type='xsd:string' />
  </xsd:choice>
 </xsd:complexType>
 <xsd:element name='R' type='typeR'/>
 <xsd:complexType name='typeR'>
  <xsd:sequence>
   <xsd:element ref='A' />
     <xsd:choice>
      <xsd:element ref='B' maxOccurs='unbounded' />
       <xsd:sequence>
        <xsd:element ref='C' />
        <xsd:element ref='D' minOccurs='0' maxOccurs='unbounded' />
       </xsd:sequence>
     </xsd:choice>
   <xsd:element ref='E'/>
   <xsd:element ref='F'/>
  </xsd:sequence>
  <xsd:attribute name='country' type='xsd:NMTOKEN' fixed='US'/>
 </xsd:complexType>
</xsd:schema>
```

Label: 800

FIG. 8

```xml
<?xml version="1.0" ?>
<rules>
 <declaration>
  <streams>
   <stream>
    <stream-ID>0</stream-ID>
    <description>default integer stream</description>
   </stream>
   ...
  </streams>
  <counters>
   <state-number>25</state-number>
   <element-number>8</element-number>
   <attribute-number>0</attribute-number>
   <stream-number>2</stream-number>
  </counters>
 </declaration>
 ...
 <rule>
  <name>B</name>
  <ID>2</ID>
  <state>
   <state-ID>7</state-ID>
   <transition>
    <event>
     <type>Text&ElementEnd</type>
     <XPath>A</XPath>
     <nameSpaceURI> http://www.samplenamespace.com </nameSpaceURI>
    </event>
    <next-state>-1</next-state>
    <hold>0</hold>
    <sub-state>0</sub-state>
    <output-list>
     <output>
      <stream-ID>1</stream-ID>
      <type-ID>0</type-ID>
      <para />
     </output>
    </output-list>
    <attributes />
   </transition>
  </state>
 </rule>
 ...
 <rule-any> ... </rule-any>
 <rule-doc> ... </rule-doc>
</rules>
```

SYSTEMS AND METHODS FOR EFFICIENTLY COMPRESSING AND DECOMPRESSING MARKUP LANGUAGE

CROSS REFERENCE TO RELATED APPLICATIONS

This application is related to commonly assigned copending U.S. patent application Ser. No. 10/177,830, filed Jun. 21, 2002, entitled "Method and System for Encoding a Mark-Up Language Document," which is hereby incorporated by reference in its entirety.

COPYRIGHT NOTICE AND PERMISSION

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright © 2002-2005, Microsoft Corp.

FIELD OF THE INVENTION

The present invention provides systems and methods for or relating to the compression and/or decompression of markup data, such as XML data. More particularly, the present invention provides systems and methods for or relating to compressing and/or decompressing markup data with a finite state machine and a rule file.

BACKGROUND OF THE INVENTION

Today, the eXtensible Markup Language (XML) is the foundation of many Web Services architectures and plays a significant and widespread role in computer networking products and data exchanges. However, XML data tends to be comprehensively defined, or verbose in vernacular terms, and thus, the data size of any particular XML representation is likely to be several times the size of the raw data represented by the XML. Therefore, it is desirable, and even critical for some applications, to efficiently compress XML data to reduce network bandwidth and storage usage, i.e., to improve the compression ratio.

In consideration of this problem, to efficiently compress XML data, a schema-aided XML compression scheme was developed that improves the compression ratio generally by separating the structure of an XML document from its content, improving the compression efficiency of the structure part by utilizing XML schema, grouping the content into different groups with related meaning or type, and applying native encoding to different types of content. For instance, U.S. patent application Ser. No. 10/177,830, filed Jun. 21, 2002, entitled "Method and System for Encoding a Mark-Up Language Document" describes a method where the structure of the mark-up language document is condensed by removing those parts of the structure that are fixed, and by expressing the variable parts of the structure in terms of which elements occur, whether elements occur, or how often certain elements occur. This may involve separating the structure of the mark-up language document from its content, and treating the structure and content differently. In various embodiments described in the '830 application, the content of the mark-up language document is, itself, compressed by grouping similar or related data items together.

The key, or general, idea of such compression techniques is the utilization of the underlying XML schema to improve the compression ratio. In general, however, many cooperating machines can present difficulties with such systems when the computers are not co-located with access to the same XML schema, or representation thereof. Plus, any improvement to XML compression or decompression speed or compression ratio can result in large savings for large amounts of data; thus, improvements to prior art compression systems are desirable.

SUMMARY OF THE INVENTION

In view of the foregoing, the present invention provides systems and methods for compressing markup language data, such as XML data, that utilizes a finite state machine (FSM), which is representative of an XML schema, and a rule file. Information defined in an XML schema is abstracted into a finite state machine (FSM). The rule file defined in accordance with the invention ensures that a compressor and de-compressor have consistent FSMs when the compressor and de-compressor for XML data are not in the same location, such as is generally the case for Web Services scenarios or other client/server scenarios. With the rule file, FSMs can be easily stored, transmitted and updated.

Other features of the present invention are described below.

BRIEF DESCRIPTION OF THE DRAWINGS

The system and methods for compressing and decompressing markup language data are further described with reference to the accompanying drawings in which:

FIG. 8 illustrates the "longhand" form of an XML schema represented in shorthand in the specification used as an example to show the generation of a FSM in accordance with the invention;

FIG. 17 illustrates exemplary, non-limiting structure for a rule file in accordance with the invention;

DETAILED DESCRIPTION OF ILLUSTRATIVE EMBODIMENTS

Overview

Figure 1:
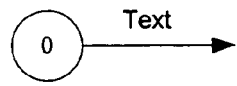
FIGS. 1-7 show the FSMs corresponding to various basic concepts associated with an XML schema.

As mentioned in the background, improvements to existing markup compression systems, which use knowledge of the underlying XML schema and its structure, are desirable. Accordingly, for compression and decompression of markup data, the invention provides a system that uses a finite state machine (FSM) and a rule file, in a manner that improves performance of compression of markup data in terms of compression ratio and speed.

The invention includes at least two key components: the FSM and rule file, which are designed to efficiently compress XML documents by utilizing XML schema. In accordance with the process for generating a FSM in accordance with the invention, the FSM is generated from and the equivalent of an XML schema. The FSM can be used to improve the compression performance in terms of compression ratio and speed. Additionally, the FSM can be serialized into a rule file for storing, transmitting and updating.

Giving some background concerning FSMs, in general, a state machine is any "device" or "object" that stores the status of something at a given time and can operate on input to change the status and/or cause an action or output to take place for any given change. For instance, a computer is basically a state machine and each machine instruction is input that changes one or more states and may cause other actions to take place. Notionally, one can think of each computer's data register as storing a state. The read-only memory from which a boot program is loaded stores a state (the boot program itself is an initial state). The operating system is itself a state and each application that runs begins with some initial state that may change as it begins to handle input. Thus, at any moment in time, a computer system can be seen as a very complex set of states and each program in it as a state machine. In practice, however, state machines are used to develop and describe specific device or program interactions.

To summarize, a state machine can be described as:
1. An initial state or record of something stored someplace;
2. A set of possible input events;
3. A set of new states that may result from the input; and
4. A set of possible actions or output events that result from a new state.

Another way of defining a state machine is as follows:
1. A set of input events;
2. A set of output events;
3. A set of states;
4. A function that maps states and input to output;
5. A function that maps states and inputs to states (which is called a state transition function); and
6. A description of the initial state.

A finite state machine (FSM), in turn, is one that has a limited or finite number of possible states. While an infinite state machine is conceivable, it is not practical. A FSM can be used both as a development tool for approaching and solving problems and as a formal way of describing the solution for later developers and system maintainers. There are a number of ways to show state machines, from simple tables through graphically animated illustrations, and a number of ways to store various parts or all of a state machine as one or more data structures.

In accordance with the invention, FSMs are created from XML schema to represent the XML schema. In this regard, applying the techniques of the invention, each XML schema uniquely maps to a FSM, and from a FSM, the corresponding XML schema may be reconstructed. The format of FSMs in accordance with the invention and how FSMs are created from XML schema is described below. While knowledge of the underlying structure of the XML schema has been used in compression in the past, as described in the background, the use of FSMs as a particular representation of XML schema in the manner of the invention has not been achieved before. The generation of FSMs in accordance with the invention is described in more detail below. Additionally, to store a FSM, transmit a FSM, or update a FSM through one or more networks in accordance with the invention, the FSM in memory (such as RAM), is reduced into a physical file format, called a rule file. The format of the rule file is also addressed below in detail.

Systems and Methods for Generating FSMs from XML Schema

By way of introduction to XML Schema for the unfamiliar reader, an XML schema describes the structure of an XML document. XML schemas define elements/attributes that can appear in a document, which elements are child elements, the sequence in which the child elements can appear, the number of child elements, whether an element is empty or can include text, and data types for elements/attributes.

The most basic concepts of XML schema are "element", "simple type" and "complex type". "element" is used to define elements that can appear in an XML document while the other two terms are used to define element types. "simple type" means the basic types, such as string or integer. Elements defined as "simple type" contain only text and can't have any child element. "complex type" is used to define elements with complex structure. Elements defined as "complex type" have child elements and there are several basic categories of "complex type". "sequence" means a complex element containing a sequence of other elements. "choice" means a complex element containing one of other elements. "repeat" (indicated by "minOccurs" and "maxOccurs" in XML schema) means a complex element containing multiple instances of other element. "complex type" may be recursive, which is, "complex type" may contain other "complex type".

There is a special term called "any" which is used to extend the XML document with elements not specified by the schema. "any" means that any XML fragment can occur.

In accordance with the invention, a FSM is created from an XML schema and is the equivalent of XML schema in computer memory. Using a FSM can improve the compression performance in terms of compressing/de-compressing speed and by abstracting the information defined in the XML schema into the FSM, the compression ratio can also be improved. A FSM is event-driven and all input is treated as different events. As described more generally above, a FSM in accordance with the invention comprises states and the basic behavior of a FSM is, given a state, based on the input/event, move to a specific next state and generate some output such as a value or a string. Each state has a unique integer ID to identify the state, and some transitions to indicate what to do upon occurrence of various events. Each transition consists of an event, a next state ID for deciding to which state to move, and an action to indicate what the output is.

To convert XML schema into FSM, the following events are defined:
ElementStart: the start of an element (open tag of an element)
ElementEnd: the end of an element (close tag of an element)
Text: the textural data (#PCDATA in terms of XML)
Text&ElementEnd: text and the end of an element
DocStart: the start of an XML document
DocEnd: the end of an XML document
The reason to define an extra "Text&ElementEnd" event is to reduce the size of the FSM because an "ElementEnd" event directly follows a "Text" event very frequently. For convenience, in the following sections, "TE" presents "Text&ElementEnd". "Start[A]", "End[A]", "Text[A]" and "TE[A]" present "start event of element A", "end event of element A", "text event of element A, and "text and end event of element A", respectively. "Start[*]", "End[*]", "Text[*]" and "TE[*]" present "start event of any element", "end event of any element", "text event of any element, and "text and end event of any element", respectively.

The output of "ElementStart" event and "ElementEnd" event are the name and namespace/prefix of the element. The output of "Text" event is the textual data itself. The output of "Text&ElementEnd" event is the sum of the output of "Text" event and "ElementEnd" event. The output of "DocStart" event is the prolog information of the XML document such as XML declaration, document type declaration and so on. "DocEnd" event has no output generally.

In accordance with the invention, a FSM is generated from an XML schema in a recursive manner. First, it is observed that #PCDATA and element definition with "simple type" have a fixed FSM. Then, based on these FSMs, the FSMs of element references and element definitions with "complex type" are constructed. FIGS. 1-6 show the FSM of each case.

Figure 2:
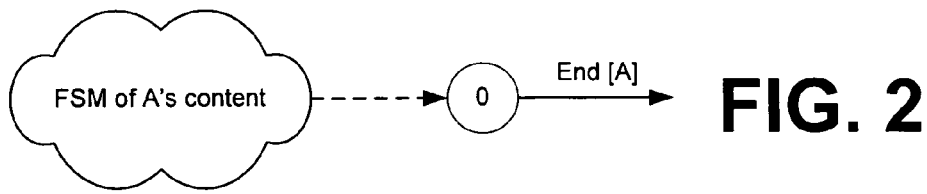
Figure 3:
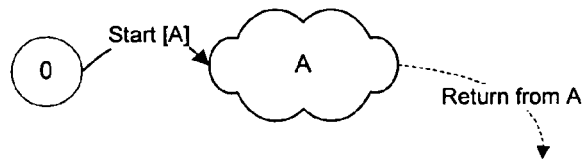

In FIGS. 2 and 3, it is noted that event "Start [A]" is processed in the FSM by reference to element A as opposed to the FSM of the definition of element A. By doing so, the whole FSM is simplified because no extra states are created in places where element A is referred to.

Figure 4:
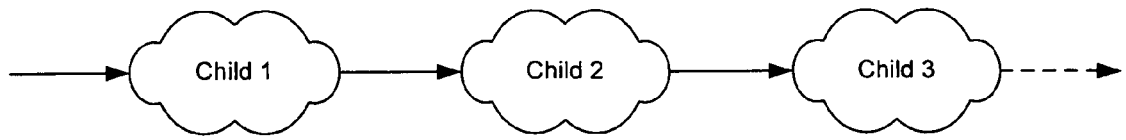

FIG. 4 shows a FSM of "sequence" which is constructed by linking the children FSMs without any new state created.

Figure 5:
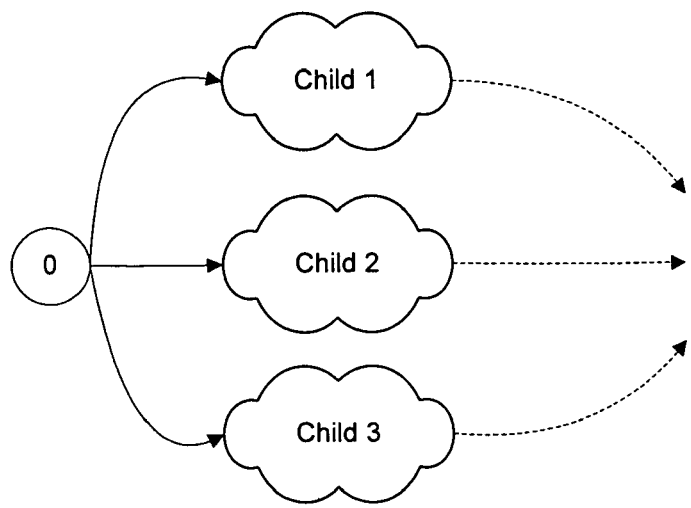

FIG. 5 shows a FSM of "choice". A new state is created with one or more transitions to each child.

Figure 6:
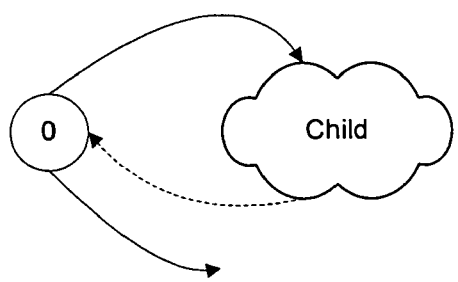

FIG. 6 shows a FSM of "repeat". A new state is created with one or more transitions to the child and the end of the child's FSM goes back to the new state. If the input event isn't for the child, the state has another transition to break the cycle.

In FIGS. 4-6, each line with an arrow may present one or more transitions. The events of these transitions are decided by the children of "sequence", "choice" and "repeat". In fact, these events are the events first processed in the children FSMs. For each of these events, a corresponding transition is created "jumping into" the corresponding child's FSM.

Figure 7:
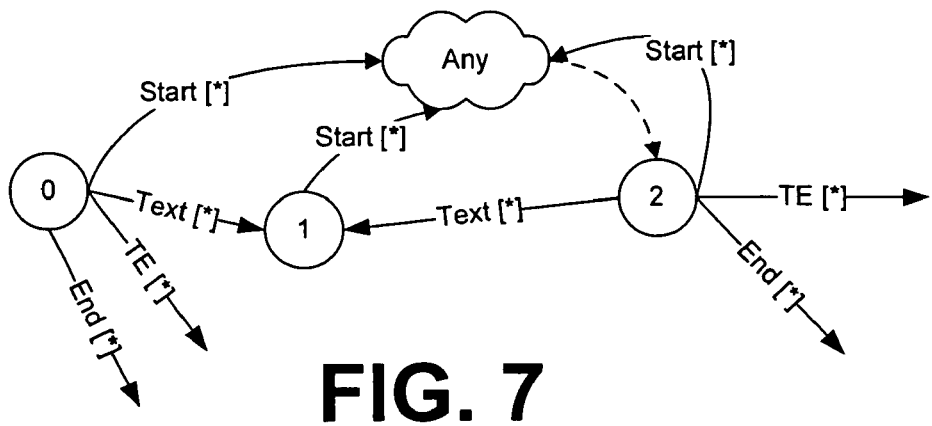
Figure 9:
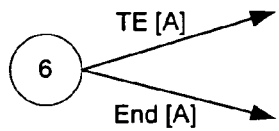
FIGS. 9-15 show the FSMs of various elements of the exemplary XML schema of FIG. 8.
Figure 10:
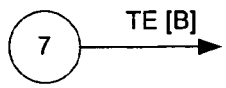
Figure 11:
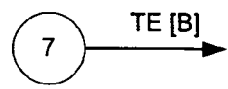
Figure 12:
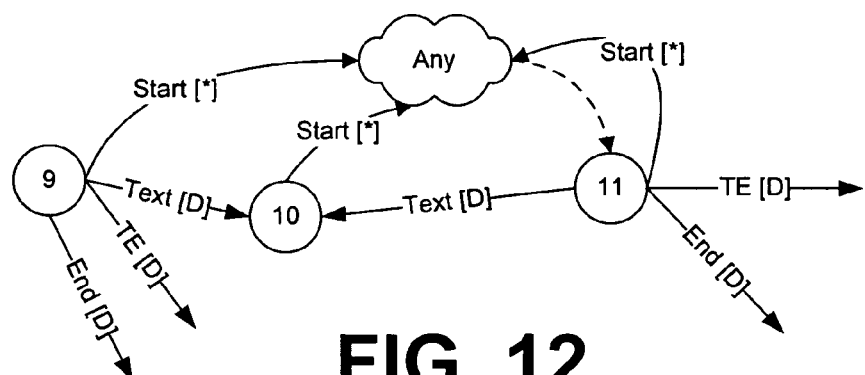
Figure 13:
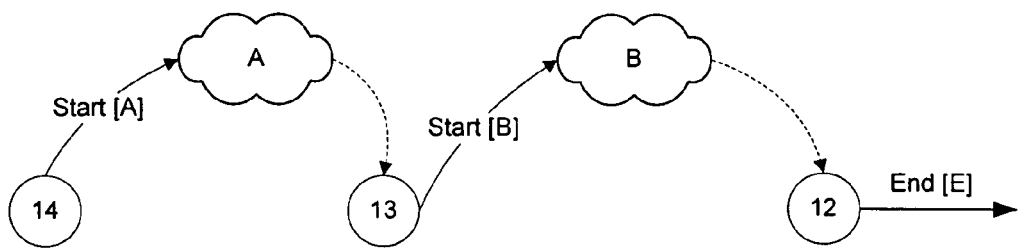
Figure 14:
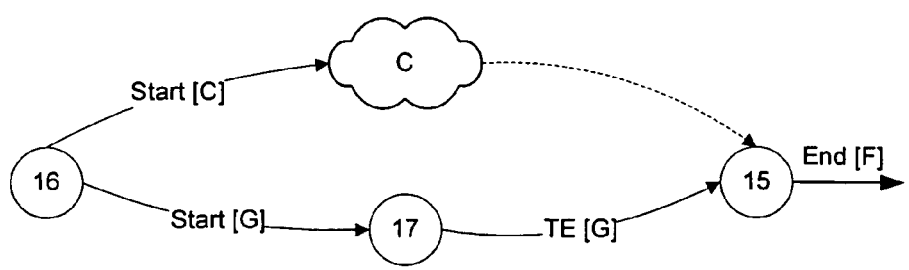

For "any", the default FSM is defined as shown in FIG. 7. The FSM is recursive itself and can process any XML fragment.

Exemplary Generation of a FSM

To clearly address how FSM is generated from XML schema, this section shows an example with the following XML schema sample:

A=B=C=G=#PCDATA
D=ANY
E=A,B
F=C|G
R=A,(B⁺|CD*),E,F
Where
A is nillable;
G is a local element;
A, B, C, D, E, F, and R are global elements;
Both E and R have an attribute.

Please note that this is an abbreviate expression of the schema and the formal version 800 is shown in FIG. 8.

Based on the above-described techniques, the FSM of element A, B, C, D, E, F, G and R of this exemplary schema are illustrated in FIGS. 9-15.

Figure 15:
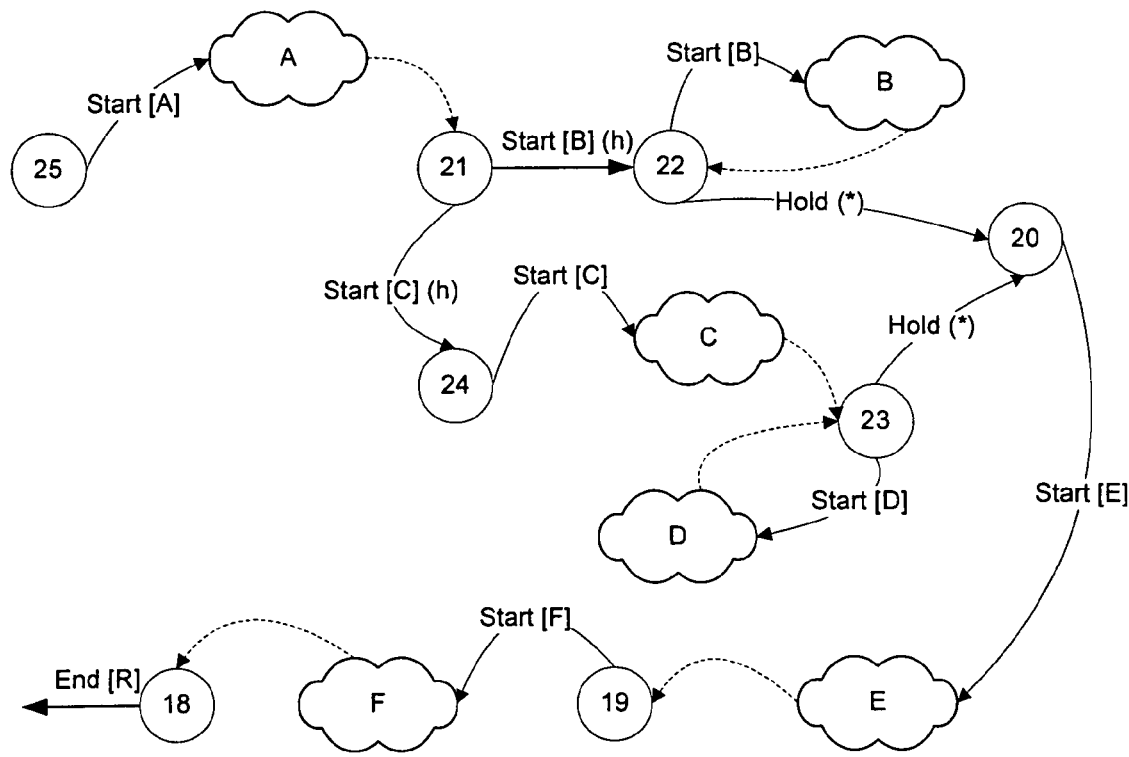

In FIG. 15, it is noted that some events are marked with "(h)" which means "hold". A transition with "hold" event will not consume the event in transferring from the current state to the next state. For example, if the input event is "Start [B]", the FSM will move to state 22 from state 21, but the event isn't consumed by the transition. Instead, event "Start [B]" is consumed in transition of state 22. In addition, "hold (*)" means to hold any event and this special event must be in the last transition if the state has multiple transitions. The reason why "hold" states are introduced is because the FSM generating processes of the invention are done in a recursive way and some redundant states are created at different recursive levels. However, these "hold" states can be erased with a post-processing module, thereby creating a compact FSM.

Figure 16:
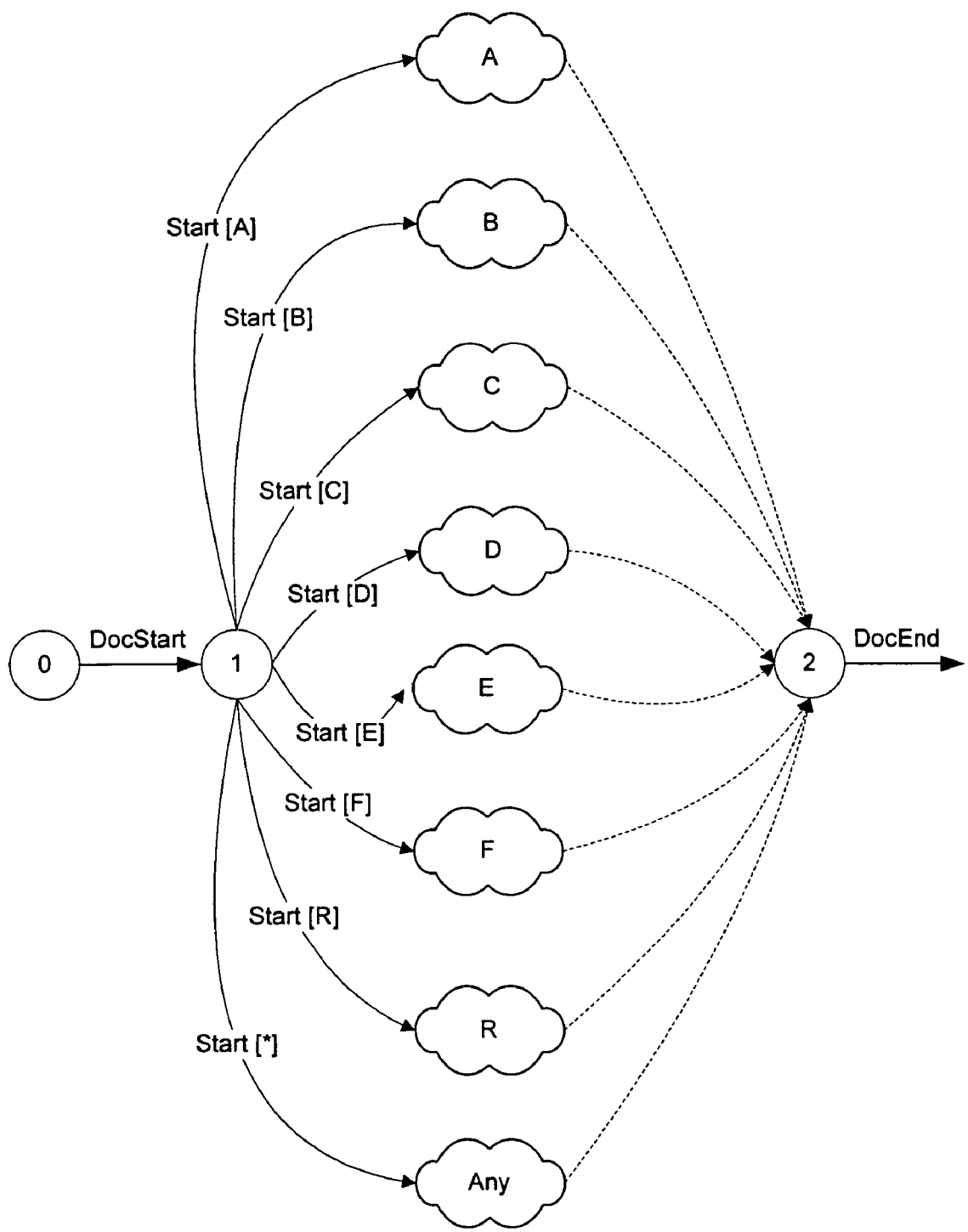
FIG. 16 illustrates the formation of the FSM corresponding to the whole XML document represented by the exemplary XML schema of FIG. 8.

As an additional step, after each element's FSM is created, the FSM of the whole XML document can be constructed as shown in FIG. 16. Three states are created in the FSM and the first state is the entry of all of the FSMs as a whole. The first state and the last state have a transition consuming "DocStart" event and "DocEnd" event, respectively. The other state has a transition which goes into the FSM of each global element and consumes the corresponding "ElementStart" event. If the first element of the XML document isn't defined in the schema, the state also has a transition to the FSM of "any". This feature gives the FSM the ability to process any XML documents, even if they are not defined by the XML schema. Of course, in this case, the compression ratio will decrease because the information defined in the schema can't be utilized.

Systems and Methods for Using Rule Files in Connection with FSMs

To compress and de-compress an XML document precisely, the compressor and de-compressor have to use the same FSM. However, it often is the case where the compressor and de-compressor aren't in the same location, such as in a Web Services scenario or most other client/server scenarios. To ensure that the compressor and de-compressor have consistent FSMs, therefore, a rule file is defined in accordance with the invention. A FSM can be serialized into a rule file and later created back from the rule file. With a rule file, FSM is able to be easily stored, transmitted and updated.

The rule file is also an XML file and its root element is "rules". "rules" element consists of the following sub-elements: a "declaration", zero or multiple "rule", a "rule-any", and a "rule-doc". FIG. 17 shows the an exemplary non-limiting sample rule file 1700 constructed according to an embodiment of the invention for reducing an FSM in memory to the rule file 1700.

The "declaration" node is used to provide some statistical information and has two sub-elements: "streams" and "counters". As mentioned in the background, existing systems can divide content with similar meaning or types into multiple groups and compress them into multiple outputting streams. Thus, a "streams" element in accordance with the invention describes this kind of information and consists of multiple "stream" sub-elements. Each "stream" describes a stream, including stream ID and other related information. By default, two streams are created. One is for integer values and the other one is for strings. To create customized streams, the information of related elements should be given in the following format:

```
<stream>
    <stream-ID>10</stream-ID>
    <description>customized stream</description>
    <element>
        <XPath>A</XPath>
<nameSpaceURI> http://www.samplenamespace.com </nameSpaceURI>
    </element>
    ...
</stream>
```

Because elements in different namespace can have the same name and even in the same namespace a local element can also have the same name to a global element, only both "XPath" and "nameSpaceURI" can identify a unique element. "XPath" is the path from the element to the first global element. The "XPath" of a global element is its name. For example, the "XPath" of global element "A" is still "A", and the "XPath" of local element "G" is "F/G". "nameSpaceURI" is the identifier of the namespace of an XML element.

The "counters" element provides statistical information including state number, element number, attribute number and stream number. After loading an FSM from a rule file, these numbers are used to validate the created FSM.

Each "rule" node describes a global XML element's FSM. It comprises a "name" sub-element indicating the element name, an "ID" sub-element indicating the element ID and several "state" sub-elements describing state information of the element.

Each "state" node consists of a "state-ID" sub-element indicating the state ID and several "transition" sub-elements. Each "transition" element consists of the following sub-elements. The "event" sub-element contains the information of the input event. The "next-state" sub-element is the next state ID and "−1" means the end of FSM. The "hold" sub-element indicates if the current event will be consumed. With the "hold" node, a rule file can describe the FSM with "hold" transitions. However, just as mentioned above, all "hold" transitions can be erased by use of a post-processing procedure after the FSM was created or loaded. A "sub-state" sub-element is used to jump into another FSM (in case of referring other element) from a current FSM and "0" means the next state is still in the current FSM. If the transition will jump into the other FSM, this sub-element is used to store the state ID after returning from the other FSM. For example, in FIG. 13, state 14 has a transition jumping into element A's FSM. After returning from element A's FSM, the next state should be state 13. In this case, the "sub-state" of the transition is "13" so that the transition is able to move to the correct state after returning from element A's FSM. The "output-list" sub-element contains the output information and can be empty when there is no output. The "attributes" sub-element is used to describe the information of the attributes of the current element and the node is not empty only if the current transition consumes a "ElementStart" event and the element has one or more attributes. If the node isn't empty, it has the following format:

Each "attribute" sub-element describes the information related to an XML attribute. "name" is the name of the attribute. "attribute-ID" is the ID assigned to the attribute. "nameSpaceURI" and "XPath" indicate the element to which the attribute belongs. "use" indicates whether the attribute is optional or not. "fixed" and "default" contain the fixed value and the default value of the attribute, if any. "output-list" is the same to the one in "transition" element. Each "output" sub-element contains the output stream ID, the output type ID (to indicate the type of the output such as string or integer), and a "para" to optionally store additional information related to the output as an extension of the techniques of the invention.

The "event" sub-element under "transition" element contains the type of the event and the identifier of the involved element ("XPath" and "nameSpaceURI").

The last two elements of the rule file are "rule-any" and "rule-doc" which include the FSMs of the "any" node and the FSM of the whole XML document, respectively. Their structure is the same as a "rule" node except that they have no "name" and "ID" sub-elements.

Figure 18A:
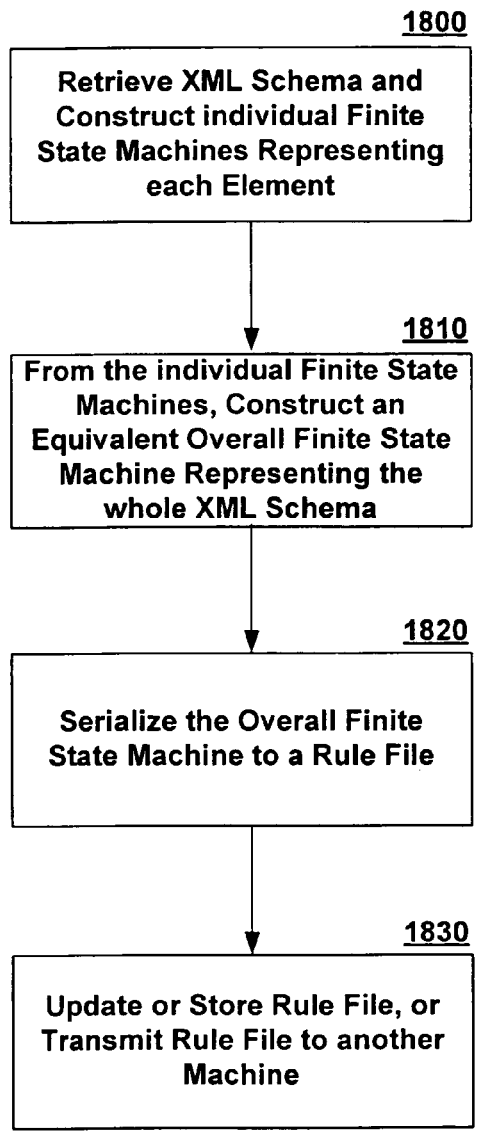
FIGS. 18A to 18B illustrate various flow diagrams showing exemplary uses of the invention.
Figure 18B:
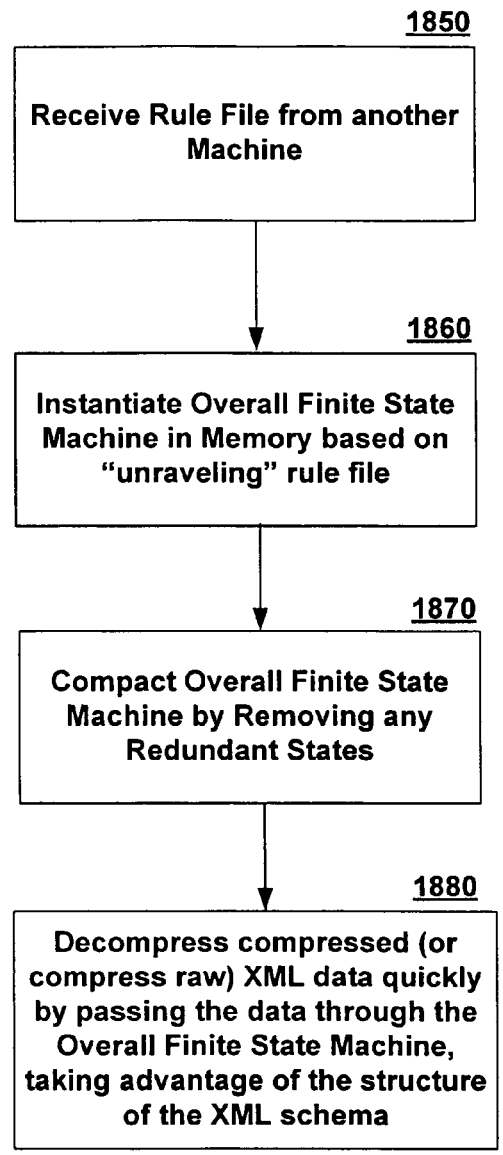

FIGS. 18A and 18B are exemplary non-limiting flow diagrams illustrating exemplary scenarios in which the invention may be utilized. For instance, in FIG. 18A, at 1800, the individual finite state machines for each element of an XML schema accessible on or from a first machine are recursively generated in the manner described above. At 1810, an overall finite state machine is constructed from the individual finite state machines, plus a document entry and exit point as shown in FIG. 16. At 1820, the overall finite state machine is serialized to a rule file according to the invention, so that the XML schema on the first machine may be efficiently delivered to a second machine, to perform efficient compression and decompression of XML data based on the same XML schema. At 1830, the rule file is stored, or updated on the first machine, or the rule file is transmitted to the second machine to update a rule file on the second machine, or to store the rule file anew.

FIG. 18B illustrates the perspective in accordance with the invention from a recipient machine that accesses, or receives from another machine, a rule file in accordance with the invention. At 1850, the rule file is accessed, retrieved or received. At 1860, an overall finite state machine is instantiated in memory, such as RAM, of the recipient machine. Then, optionally at 1870, the overall finite state machine is compacted by removing any redundant states. At 1880, any

```
<attributes>
<attribute>
<name>orderDate</name>
    <attribute-ID>0</attribute-ID>
    <nameSpaceURI>http://www.samplenamespace.com</nameSpaceURI>
    <XPath>E</XPath>
    <use>optional</use>
    <fixed />
    <default />
<output-list>
    <output>
        <stream-ID>1</stream-ID>
        <type-ID>0</type-ID>
        <para />
    </output>
        </output-list>
        </attribute>
</attributes>
```

XML data can be quickly compressed or decompressed by utilizing the state flow based on inputs and events of the overall finite state machine.

Exemplary Networked and Distributed Environments

One of ordinary skill in the art can appreciate that the invention can be implemented in connection with any computer or other client or server device, which can be deployed as part of a computer network, or in a distributed computing environment. In this regard, the present invention pertains to any computer system or environment having any number of memory or storage units, and any number of applications and processes occurring across any number of storage units or volumes, which may be used in connection with compression or decompression processes in accordance with the present invention. The present invention may apply to an environment with server computers and client computers deployed in a network environment or distributed computing environment, having remote or local storage. The present invention may also be applied to standalone computing devices, having programming language functionality, interpretation and execution capabilities for generating, receiving and transmitting information in connection with remote or local services and processes. XML data, currently a nearly ubiquitous form of markup language, can be located anywhere and retrieved or transmitted worldwide via computing networks, and thus the techniques for compressing and decompressing XML data in accordance with the present invention can be applied with great efficacy in these environments.

Distributed computing provides sharing of computer resources and services by exchange between computing devices and systems. These resources and services include the exchange of information, cache storage and disk storage for objects, such as files. Distributed computing takes advantage of network connectivity, allowing clients to leverage their collective power to benefit the entire enterprise. In this regard, a variety of devices may have applications, objects or resources that may implicate the systems and methods for compressing and decompressing data in accordance with the invention.

Figure 19A:
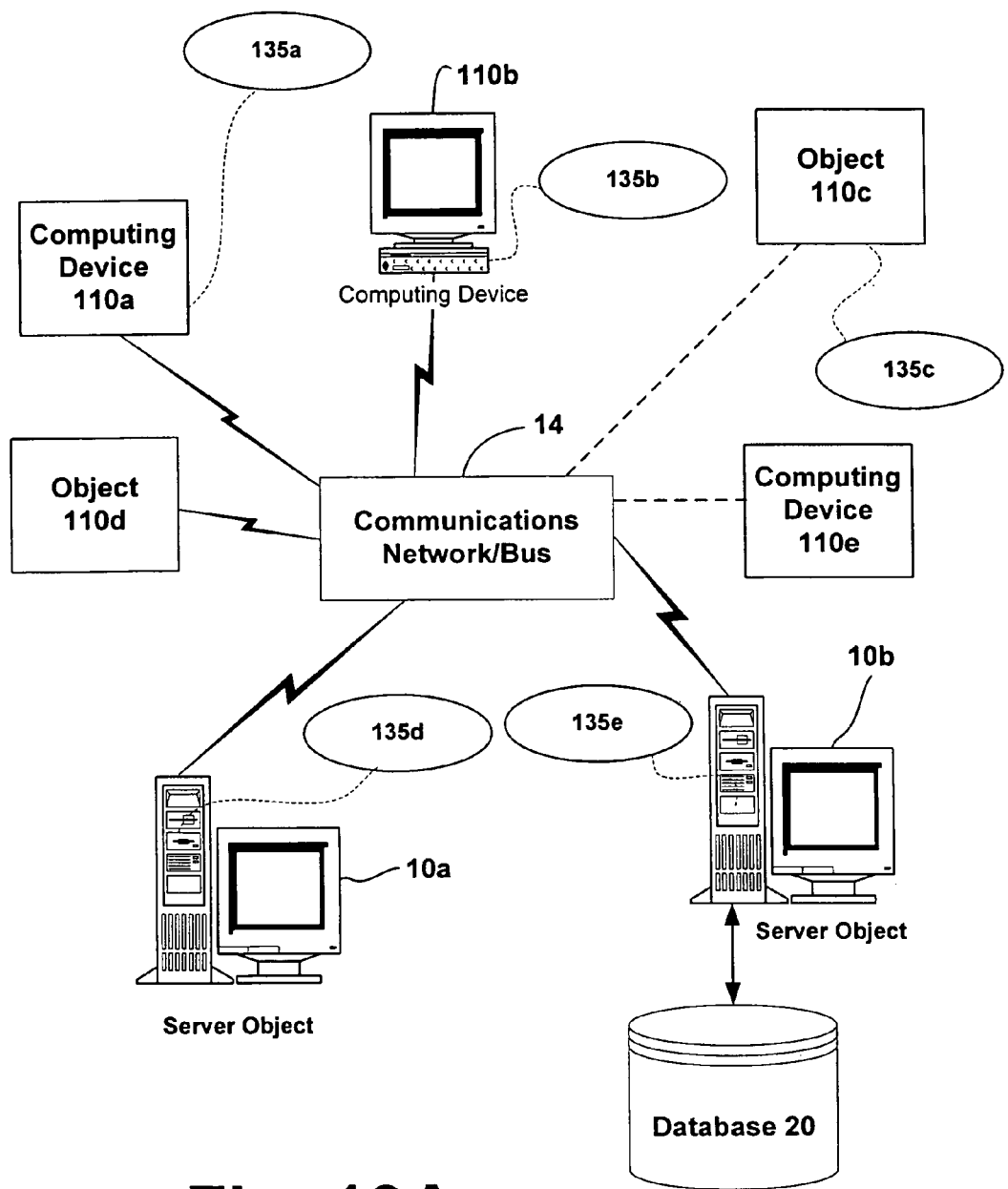
FIG. 19A is a block diagram representing a suitable computing system environment in which the present invention may be implemented.

FIG. 19A provides a schematic diagram of an exemplary networked or distributed computing environment. The distributed computing environment comprises computing objects 10a, 10b, etc. and computing objects or devices 110a, 110b, 110c, etc. These objects may comprise programs, methods, data stores, programmable logic, etc. The objects may comprise portions of the same or different devices such as PDAs, audio/video devices, MP3 players, personal computers, etc. Each object can communicate with another object by way of the communications network 14. This network may itself comprise other computing objects and computing devices that provide services to the system of FIG. 19A, and may itself represent multiple interconnected networks. In accordance with an aspect of the invention, each object 10a, 10b, etc. or 110a, 110b, 110c, etc. may contain an application that might make use of an API, or other object, software, firmware and/or hardware, suitable for use with the systems and methods for compressing and decompressing markup data in accordance with the invention.

It can also be appreciated that an object, such as 110c, may be hosted on another computing device 10a, 10b, etc. or 110a, 110b, etc. Thus, although the physical environment depicted may show the connected devices as computers, such illustration is merely exemplary and the physical environment may alternatively be depicted or described comprising various digital devices such as PDAs, televisions, MP3 players, etc., software objects such as interfaces, COM objects and the like.

There are a variety of systems, components, and network configurations that support distributed computing environments. For example, computing systems may be connected together by wired or wireless systems, by local networks or widely distributed networks. Currently, many of the networks are coupled to the Internet, which provides an infrastructure for widely distributed computing and encompasses many different networks. Any of the infrastructures may be used for exemplary communications made incident to applying the compression and decompression techniques of the present invention.

In home networking environments, there are at least four disparate network transport media that may each support a unique protocol, such as Power line, data (both wireless and wired), voice (e.g., telephone) and entertainment media. Most home control devices such as light switches and appliances may use power lines for connectivity. Data Services may enter the home as broadband (e.g., either DSL or Cable modem) and are accessible within the home using either wireless (e.g., HomeRF or 802.11B) or wired (e.g., Home PNA, Cat 5, Ethernet, even power line) connectivity. Voice traffic may enter the home either as wired (e.g., Cat 3) or wireless (e.g., cell phones) and may be distributed within the home using Cat 3 wiring. Entertainment media, or other graphical data, may enter the home either through satellite or cable and is typically distributed in the home using coaxial cable. IEEE 1394 and DVI are also digital interconnects for clusters of media devices. All of these network environments and others that may emerge, or already have emerged, as protocol standards may be interconnected to form a network, such as an intranet, that may be connected to the outside world by way of a wide area network, such as the Internet. In short, a variety of disparate sources exist for the storage and transmission of data, and consequently, moving forward, computing devices will require ways of sharing data, such as data accessed or utilized incident to program objects, which implement one or more portions of the compression and decompression systems and methods in accordance with the present invention.

The Internet commonly refers to the collection of networks and gateways that utilize the Transmission Control Protocol/Internet Protocol (TCP/IP) suite of protocols, which are well-known in the art of computer networking. The Internet can be described as a system of geographically distributed remote computer networks interconnected by computers executing networking protocols that allow users to interact and share information over network(s). Because of such wide-spread information sharing, remote networks such as the Internet have thus far generally evolved into an open system with which developers can design software applications for performing specialized operations or services, essentially without restriction.

Thus, the network infrastructure enables a host of network topologies such as client/server, peer-to-peer, or hybrid architectures. The "client" is a member of a class or group that uses the services of another class or group to which it is not related. Thus, in computing, a client is a process, i.e., roughly a set of instructions or tasks, that requests a service provided by another program. The client process utilizes the requested service without having to "know" any working details about the other program or the service itself. In a client/server architecture, particularly a networked system, a client is usually a computer that accesses shared network resources provided by another computer, e.g., a server. In the illustration of FIG. 19A, as an example, computers 110a, 110b, etc. can be thought of as clients and computers 10a, 10b, etc. can be thought of as servers where servers 10a, 10b, etc. contain or maintain the data that is then replicated or otherwise transmitted to client computers 110a, 110b, etc., although any computer can be considered a client, a server, or both, depending on the circumstances. Any of these computing devices may be processing data or requesting services or tasks that may implicate the compression and decompression techniques of the invention.

A server is typically a remote computer system accessible over a remote or local network, such as the Internet. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques for compressing and decompressing XML or other markup data of the invention may be distributed across multiple computing devices or objects.

Client(s) and server(s) communicate with one another utilizing the functionality provided by protocol layer(s). For example, HyperText Transfer Protocol (HTTP) is a common protocol that is used in conjunction with the World Wide Web (WWW), or "the Web." Typically, a computer network address such as an Internet Protocol (IP) address or other reference such as a Universal Resource Locator (URL) can be used to identify the server or client computers to each other. The network address can be referred to as a URL address. Communication can be provided over a communications medium, e.g., client(s) and server(s) may be coupled to one another via TCP/IP connection(s) for high-capacity communication.

Thus, FIG. 19A illustrates an exemplary networked or distributed environment, with server(s) in communication with client computer (s) via a network/bus, in which the present invention may be employed. In more detail, a number of servers 10a, 10b, etc., are interconnected via a communications network/bus 14, which may be a LAN, WAN, intranet, the Internet, etc., with a number of client or remote computing devices 110a, 110b, 110c, 110d, 110e, etc., such as a portable computer, handheld computer, thin client, networked appliance, or other device, such as a VCR, TV, oven, light, heater, etc. It is thus contemplated that the present invention may apply to any computing device in connection with which it is desirable to compress, decompress, update, send, or transmit markup data.

In a network environment in which the communications network/bus 14 is the Internet, for example, the servers 10a, 10b, etc. can be Web servers with which the clients 110a, 110b, 110c, 110d, etc. communicate via any of a number of known protocols such as HTTP. Servers 10a, 10b, etc. may also serve as clients 110a, 110b, 110c, 110d, etc., as may be characteristic of a distributed computing environment.

As mentioned, communications may be wired or wireless, or a combination, where appropriate. Client devices 110a, 110b, 110c, 110d, 110e, etc. may or may not communicate via communications network/bus 14, and may have independent communications associated therewith. For example, in the case of a TV or VCR, there may or may not be a networked aspect to the control thereof. Each client computer 110a, 110b, 110c, 110d, 110e, etc. and server computer 10a, 10b, etc. may be equipped with various application program modules or objects 135a, 135b, 135c, etc. and with connections or access to various types of storage elements or objects, across which files or data streams may be stored or to which portion(s) of files or data streams may be downloaded, transmitted or migrated. Any one or more of computers 110a, 110b, 110a, 110b, etc. may be responsible for the maintenance and updating of a database 20 or other storage element, such as a database or memory 20 for storing data processed or saved according to the invention. Thus, the present invention can be utilized in a computer network environment having client computers 10a, 110b, etc. that can access and interact with a computer network/bus 14 and server computers 10a, 10b, etc. that may interact with client computers 110a, 110b, etc. and other like devices, and databases 20.

Exemplary Computing Device

Figure 19B:
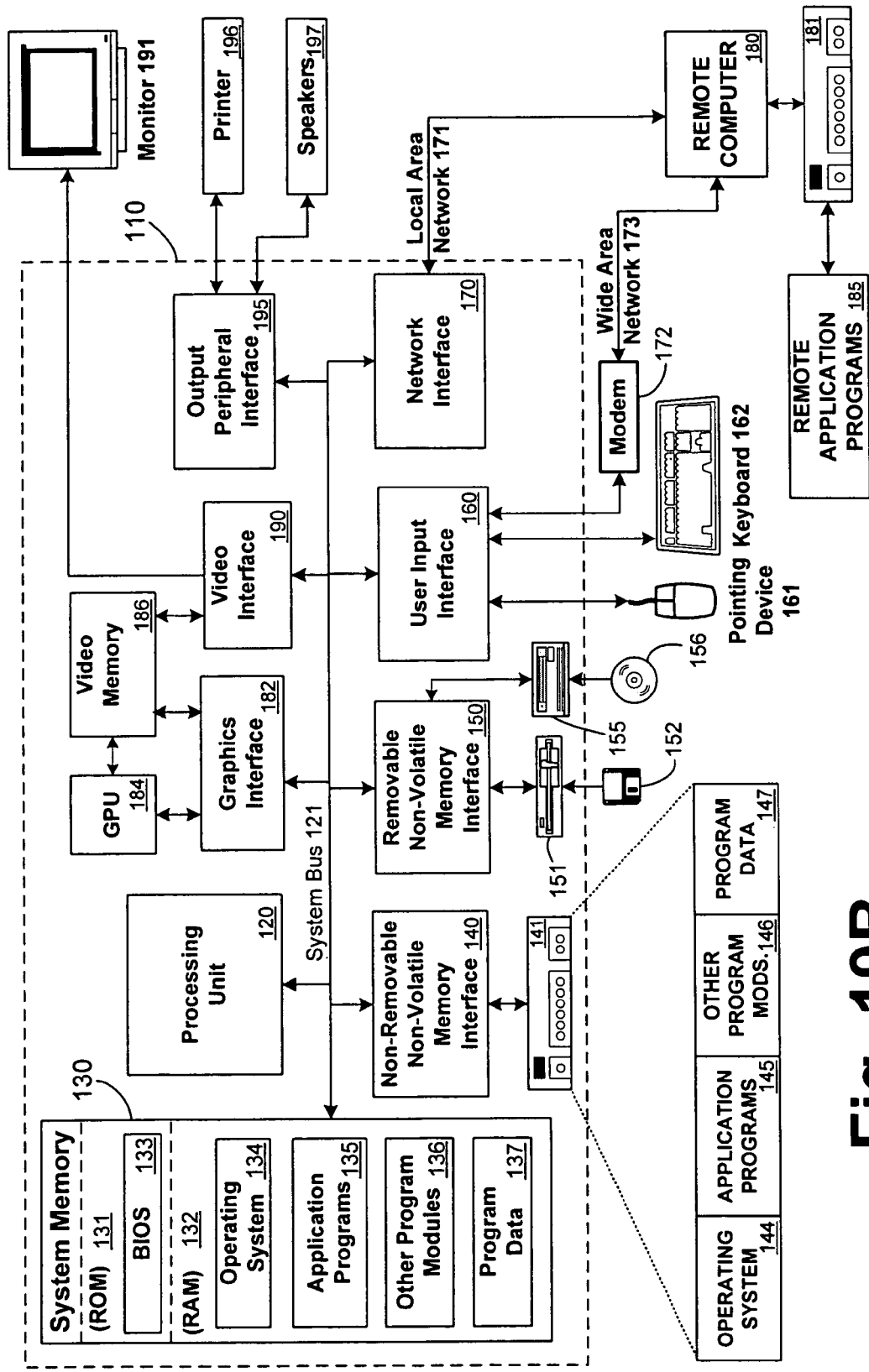
FIG. 19B is a block diagram representing an exemplary network environment in which the present invention may be implemented.

FIG. 19B and the following discussion are intended to provide a brief general description of a suitable computing environment in connection with which the invention may be implemented. It should be understood, however, that handheld, portable and other computing devices and computing objects of all kinds are contemplated for use in connection with the present invention, i.e., anywhere where that it is desirable to flexibly, or quickly process data in a computing environment. While a general purpose computer is described below, this is but one example, and the present invention may be implemented with a thin client having network/bus interoperability and interaction. Thus, the present invention may be implemented in an environment of networked hosted services in which very little or minimal client resources are implicated, e.g., a networked environment in which the client device serves merely as an interface to the network/bus, such as an object placed in an appliance. In essence, anywhere that data may be stored or from which data may be retrieved or transmitted to another computer is a desirable, or suitable, environment for operation of the techniques for downloading algorithmic elements to a coprocessor in accordance with the invention.

Although not required, the invention can be implemented via an operating system, for use by a developer of services for a device or object, and/or included within application software that operates in connection with the methods for compressing and decompressing data in accordance with the invention. Software may be described in the general context of computer-executable instructions, such as program modules, being executed by one or more computers, such as client workstations, servers or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations and protocols. Other well known computing systems, environments, and/or configurations that may be suitable for use with the invention include, but are not limited to, personal computers (PCs), automated teller machines, server computers, handheld or laptop devices, multi-processor systems, microprocessor-based systems, programmable consumer electronics, network PCs, appliances, lights, environmental control elements, minicomputers, mainframe computers and the like. The invention may also be practiced in distributed computing environments where tasks are performed by remote processing devices that are linked through a communications network/bus or other data transmission medium. In a distributed computing environment, program modules may be located in both local and remote computer storage media including memory storage devices, and client nodes may in turn behave as server nodes, as described above.

FIG. 19B thus illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 19B, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and/or a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 19B illustrates operating system 134, application programs 135, other program modules 136, and program data 137.

The computer 110 may also include other removable/non-removable, volatile/nonvolatile computer storage media. By way of example only, FIG. 19B illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 19B provide storage of computer readable instructions, data structures, program modules and other data for the computer 110. In FIG. 19B, for example, hard disk drive 141 is illustrated as storing operating system 144, application programs 145, other program modules 146 and program data 147. Note that these components can either be the same as or different from operating system 134, application programs 135, other program modules 136 and program data 137. Operating system 144, application programs 145, other program modules 146 and program data 147 are given different numbers here to illustrate that, at a minimum, they may be different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB). A graphics interface 182, such as Northbridge, may also be connected to the system bus 121. Northbridge is a chipset that communicates with the CPU, or host processing unit 120, and assumes responsibility for accelerated graphics port (AGP) communications. One or more coprocessors, such as graphics processing units (GPUs) 184, may communicate with graphics interface 182. In this regard, GPUs 184 generally include on-chip memory storage, such as register storage and GPUs 184 communicate with a video memory 186, wherein the methods for downloading algorithmic elements to a coprocessor of the invention have particular impact. GPUs 184, however, are but one example of a coprocessor and thus a variety of coprocessing devices may be included in computer 110, and may include a variety of procedural shaders, such as pixel and vertex shaders. A monitor 191 or other type of display device is also connected to the system bus 121 via an interface, such as a video interface 190, which may in turn communicate with video memory 186. In addition to monitor 191, computers may also include other peripheral output devices such as speakers 197 and printer 196, which may be connected through an output peripheral interface 195.

The computer 110 may operate in a networked or distributed environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 19B. The logical connections depicted in FIG. 19B include a local area network (LAN) 171 and a wide area network (WAN) 173, but may also include other networks/buses. Such networking environments are commonplace in homes, offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. Data communications device 172, such as a modem, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 19B illustrates remote application programs 185 as residing on memory device 181. It will be appreciated that the network connections shown are exemplary and other means of establishing a communications link between the computers may be used.

Exemplary Distributed Computing Frameworks or Architectures

Various distributed computing frameworks have been and are being developed in light of the convergence of personal computing and the Internet. Individuals and business users alike are provided with a seamlessly interoperable and Web-enabled interface for applications and computing devices, making computing activities increasingly Web browser or network-oriented.

For example, MICROSOFT®'s managed code platform, i.e., .NET, includes servers, building-block services, such as Web-based data storage and downloadable device software. Generally speaking, the NET platform provides (1) the ability to make the entire range of computing devices work together and to have user information automatically updated and synchronized on all of them, (2) increased interactive capability for Web pages, enabled by greater use of XML rather than HTML, (3) online services that feature customized access and delivery of products and services to the user from a central starting point for the management of various applications, such as e-mail, for example, or software, such as Office .NET, (4) centralized data storage, which increases efficiency and ease of access to information, as well as synchronization of information among users and devices, (5) the ability to integrate various communications media, such as e-mail, faxes, and telephones, (6) for developers, the ability to create reusable modules, thereby increasing productivity and reducing the number of programming errors and (7) many other cross-platform and language integration features as well.

While some exemplary embodiments herein are described in connection with software, such as an application programming interface (API), residing on a computing device, one or more portions of the invention may also be implemented via an operating system, or a "middle man" object, a control object, hardware, firmware, intermediate language instructions or objects, etc., such that the methods for compressing and decompressing markup data in accordance with the invention may be included in, supported in or accessed via all of the languages and services enabled by managed code, such as .NET code, and in other distributed computing frameworks as well.

Exemplary Interface Implementations

For any exchange of data among multiple computers, such as XML or other markup data that is decompressed or compressed according to the techniques of the invention and shared between two computers, there are interfaces for handling the various operations on each computer that can be implemented in hardware and/or software and which operate to receive, send and/or process the data in some fashion, according to the relevant applications and services being requested or provided. To the extent that one or more interface objects may be provided to achieve or implement any portion of the systems and methods for compressing and decompressing markup data in accordance with the invention, the invention is intended to encompass all such embodiments, and thus a general description of the kinds of interfaces that might be provided or utilized when implementing or carrying out the invention follows.

A programming interface (or more simply, interface) may be viewed as any mechanism, process, protocol for enabling one or more segment(s) of code to communicate with or access the functionality provided by one or more other segment(s) of code. Alternatively, a programming interface may be viewed as one or more mechanism(s), method(s), function call(s), module(s), object(s), etc. of a component of a system capable of communicative coupling to one or more mechanism(s), method(s), function call(s), module(s), etc. of other component(s). The term "segment of code" in the preceding sentence is intended to include one or more instructions or lines of code, and includes, e.g., code modules, objects, subroutines, functions, and so on, regardless of the terminology applied or whether the code segments are separately compiled, or whether the code segments are provided as source, intermediate, or object code, whether the code segments are utilized in a runtime system or process, or whether they are located on the same or different machines or distributed across multiple machines, or whether the functionality represented by the segments of code are implemented wholly in software, wholly in hardware, or a combination of hardware and software.

Figure 20A:
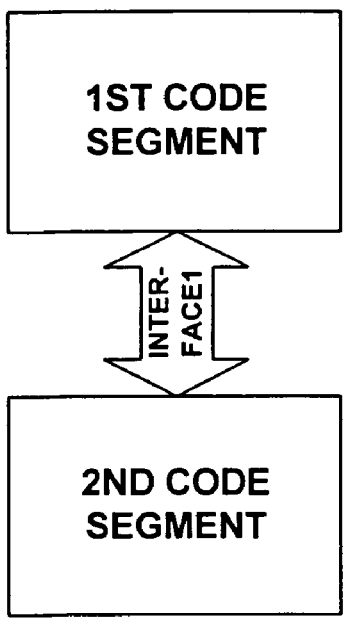
FIGS. 20A to 25B illustrate exemplary ways in which similar interface code can be provided to achieve similar or equivalent objective(s) of any interface(s) in accordance with the invention.
Figure 20B:
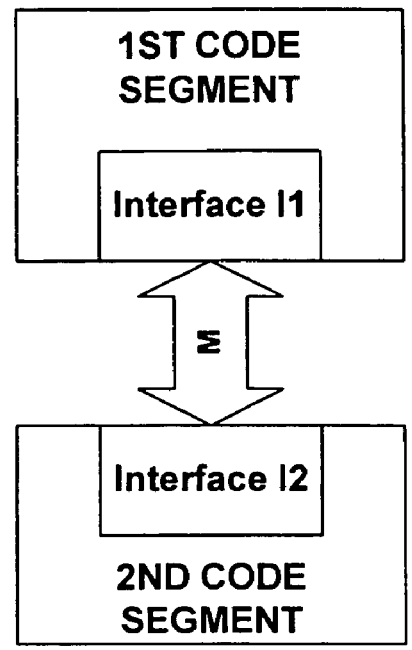

Notionally, a programming interface may be viewed generically, as shown in FIG. 20A or FIG. 20B. FIG. 20A illustrates an interface Interface1 as a conduit through which first and second code segments communicate. FIG. 20B illustrates an interface as comprising interface objects I1 and I2 (which may or may not be part of the first and second code segments), which enable first and second code segments of a system to communicate via medium M. In the view of FIG. 20B, one may consider interface objects I1 and I2 as separate interfaces of the same system and one may also consider that objects I1 and I2 plus medium M comprise the interface. Although FIGS. 20A and 20B show bi-directional flow and interfaces on each side of the flow, certain implementations may only have information flow in one direction (or no information flow as described below) or may only have an interface object on one side. By way of example, and not limitation, terms such as application programming interface (API), entry point, method, function, subroutine, remote procedure call, and component object model (COM) interface, are encompassed within the definition of programming interface.

Aspects of such a programming interface may include the method whereby the first code segment transmits information (where "information" is used in its broadest sense and includes data, commands, requests, etc.) to the second code segment; the method whereby the second code segment receives the information; and the structure, sequence, syntax, organization, schema, timing and content of the information. In this regard, the underlying transport medium itself may be unimportant to the operation of the interface, whether the medium be wired or wireless, or a combination of both, as long as the information is transported in the manner defined by the interface. In certain situations, information may not be passed in one or both directions in the conventional sense, as the information transfer may be either via another mechanism (e.g. information placed in a buffer, file, etc. separate from information flow between the code segments) or non-existent, as when one code segment simply accesses functionality performed by a second code segment. Any or all of these aspects may be important in a given situation, e.g., depending on whether the code segments are part of a system in a loosely coupled or tightly coupled configuration, and so this list should be considered illustrative and non-limiting.

This notion of a programming interface is known to those skilled in the art and is clear from the foregoing detailed description of the invention. There are, however, other ways to implement a programming interface, and, unless expressly excluded, these too are intended to be encompassed by the claims set forth at the end of this specification. Such other ways may appear to be more sophisticated or complex than the simplistic view of FIGS. 20A and 20B, but they nonetheless perform a similar function to accomplish the same overall result. We will now briefly describe some illustrative alternative implementations of a programming interface.

A. Factoring

Figure 21A:
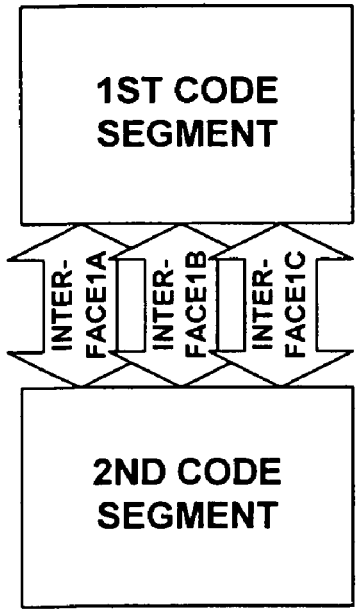
Figure 21B:
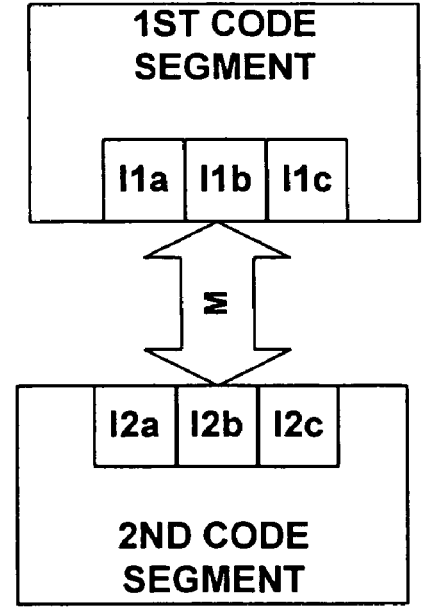

A communication from one code segment to another may be accomplished indirectly by breaking the communication into multiple discrete communications. This is depicted schematically in FIGS. 21A and 21B. As shown, some interfaces can be described in terms of divisible sets of functionality. Thus, the interface functionality of FIGS. 20A and 20B may be factored to achieve the same result, just as one may mathematically provide 24, or 2 times 2 time 3 times 2. Accordingly, as illustrated in FIG. 21A, the function provided by interface Interface1 may be subdivided to convert the communications of the interface into multiple interfaces Interface 1A, Interface 1B, Interface 1C, etc. while achieving the same result. As illustrated in FIG. 21B, the function provided by interface I1 may be subdivided into multiple interfaces I1$a$, I1$b$, I1$c$, etc. while achieving the same result. Similarly, interface I2 of the second code segment which receives information from the first code segment may be factored into multiple interfaces I2$a$, I2$b$, I2$c$, etc. When factoring, the number of interfaces included with the 1$^{st}$ code segment need not match the number of interfaces included with the 2$^{nd}$ code segment. In either of the cases of FIGS. 21A and 21B, the functional spirit of interfaces Interface1 and I1 remain the same as with FIGS. 20A and 20B, respectively. The factoring of interfaces may also follow associative, commutative, and other mathematical properties such that the factoring may be difficult to recognize. For instance, ordering of operations may be unimportant, and consequently, a function carried out by an interface may be carried out well in advance of reaching the interface, by another piece of code or interface, or performed by a separate component of the system. Moreover, one of ordinary skill in the programming arts can appreciate that there are a variety of ways of making different function calls that achieve the same result.

B. Redefinition

Figure 22A:
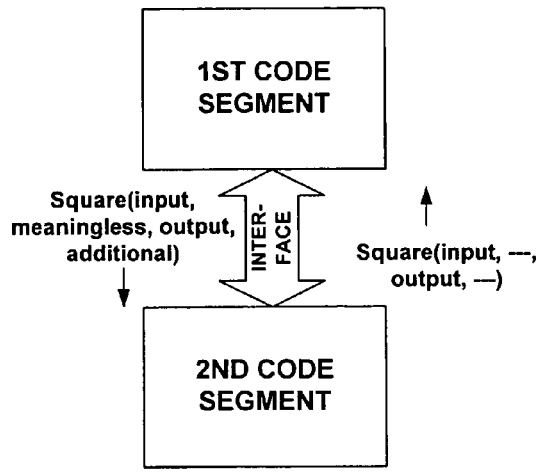
Figure 22B:
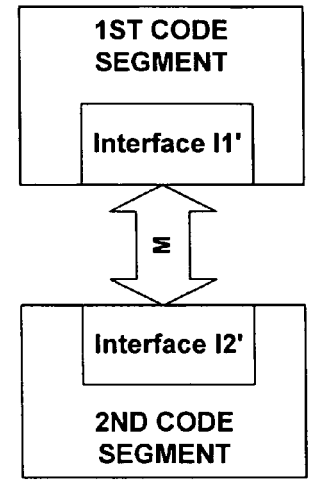

In some cases, it may be possible to ignore, add or redefine certain aspects (e.g., parameters) of a programming interface while still accomplishing the intended result. This is illustrated in FIGS. 22A and 22B. For example, assume interface Interface1 of FIG. 20A includes a function call Square(input, precision, output), a call that includes three parameters, input, precision and output, and which is issued from the 1$^{st}$ Code Segment to the 2$^{nd}$ Code Segment. If the middle parameter precision is of no concern in a given scenario, as shown in FIG. 22A, it could just as well be ignored or even replaced with a meaningless (in this situation) parameter. One may also add an additional parameter of no concern. In either event, the functionality of square can be achieved, so long as output is returned after input is squared by the second code segment. Precision may very well be a meaningful parameter to some downstream or other portion of the computing system; however, once it is recognized that precision is not necessary for the narrow purpose of calculating the square, it may be replaced or ignored. For example, instead of passing a valid precision value, a meaningless value such as a birth date could be passed without adversely affecting the result. Similarly, as shown in FIG. 22B, interface I1 is replaced by interface I1', redefined to ignore or add parameters to the interface. Interface I2 may similarly be redefined as interface I2', redefined to ignore unnecessary parameters, or parameters that may be processed elsewhere. The point here is that in some cases a programming interface may include aspects, such as parameters, that are not needed for some purpose, and so they may be ignored or redefined, or processed elsewhere for other purposes.

C. Inline Coding

Figure 23A:
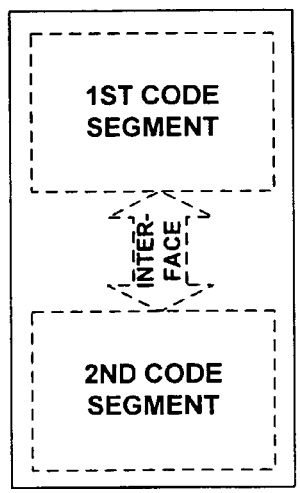
Figure 23B:
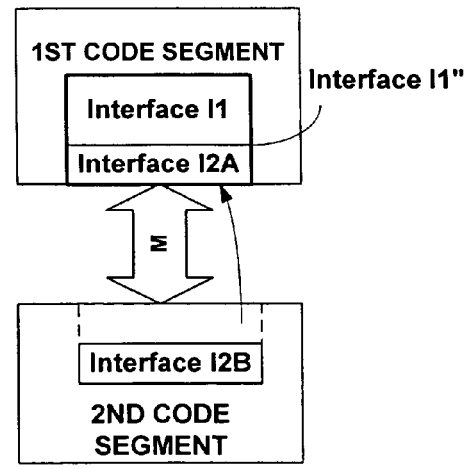

It may also be feasible to merge some or all of the functionality of two separate code modules such that the "interface" between them changes form. For example, the functionality of FIGS. 20A and 20B may be converted to the functionality of FIGS. 23A and 23B, respectively. In FIG. 23A, the previous 1$^{st}$ and 2$^{nd}$ Code Segments of FIG. 20A are merged into a module containing both of them. In this case, the code segments may still be communicating with each other but the interface may be adapted to a form which is more suitable to the single module. Thus, for example, formal Call and Return statements may no longer be necessary, but similar processing or response(s) pursuant to interface Interface1 may still be in effect. Similarly, shown in FIG. 23B, part (or all) of interface I2 from FIG. 20B may be written inline into interface I1 to form interface I1". As illustrated, interface I2 is divided into I2$a$ and I2$b$, and interface portion I2$a$ has been coded in-line with interface I1 to form interface I1". For a concrete example, consider that the interface I1 from FIG. 20B performs a function call square (input, output), which is received by interface I2, which after processing the value passed with input (to square it) by the second code segment, passes back the squared result with output. In such a case, the processing performed by the second code segment (squaring input) can be performed by the first code segment without a call to the interface.

D. Divorce

Figure 24A:
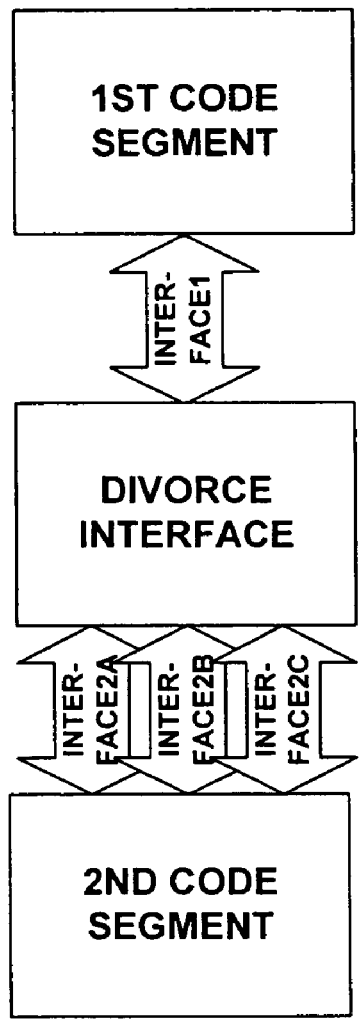
Figure 24B:
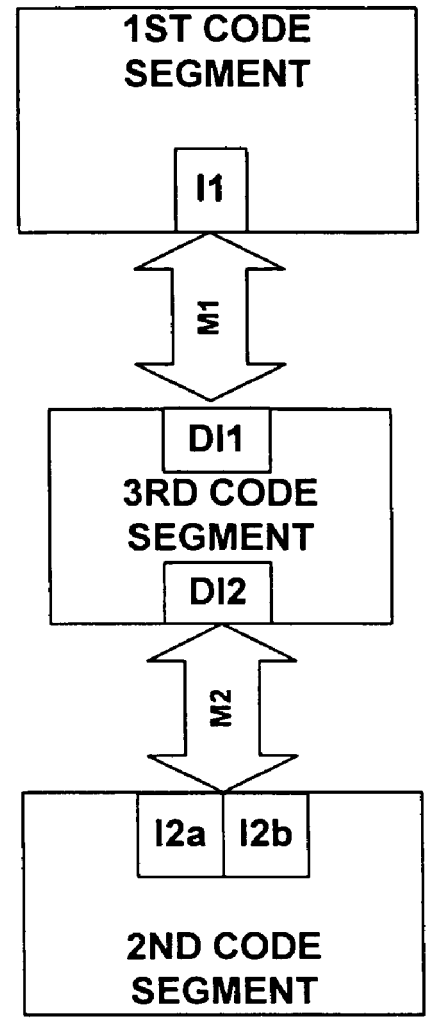

A communication from one code segment to another may be accomplished indirectly by breaking the communication into multiple discrete communications. This is depicted schematically in FIGS. 24A and 24B. As shown in FIG. 24A, one or more piece(s) of middleware (Divorce Interface(s), since they divorce functionality and/or interface functions from the original interface) are provided to convert the communications on the first interface, Interface1, to conform them to a different interface, in this case interfaces Interface2A, Interface2B and Interface2C. This might be done, e.g., where there is an installed base of applications designed to communicate with, say, an operating system in accordance with an Interface1 protocol, but then the operating system is changed to use a different interface, in this case interfaces Interface2A, Interface2B and Interface2C. The point is that the original interface used by the $2^{nd}$ Code Segment is changed such that it is no longer compatible with the interface used by the $1^{st}$ Code Segment, and so an intermediary is used to make the old and new interfaces compatible. Similarly, as shown in FIG. 24B, a third code segment can be introduced with divorce interface DI1 to receive the communications from interface I1 and with divorce interface DI2 to transmit the interface functionality to, for example, interfaces I2a and I2b, redesigned to work with DI2, but to provide the same functional result. Similarly, DI1 and DI2 may work together to translate the functionality of interfaces I1 and I2 of FIG. 20B to a new operating system, while providing the same or similar functional result.

E. Rewriting

Figure 25A:
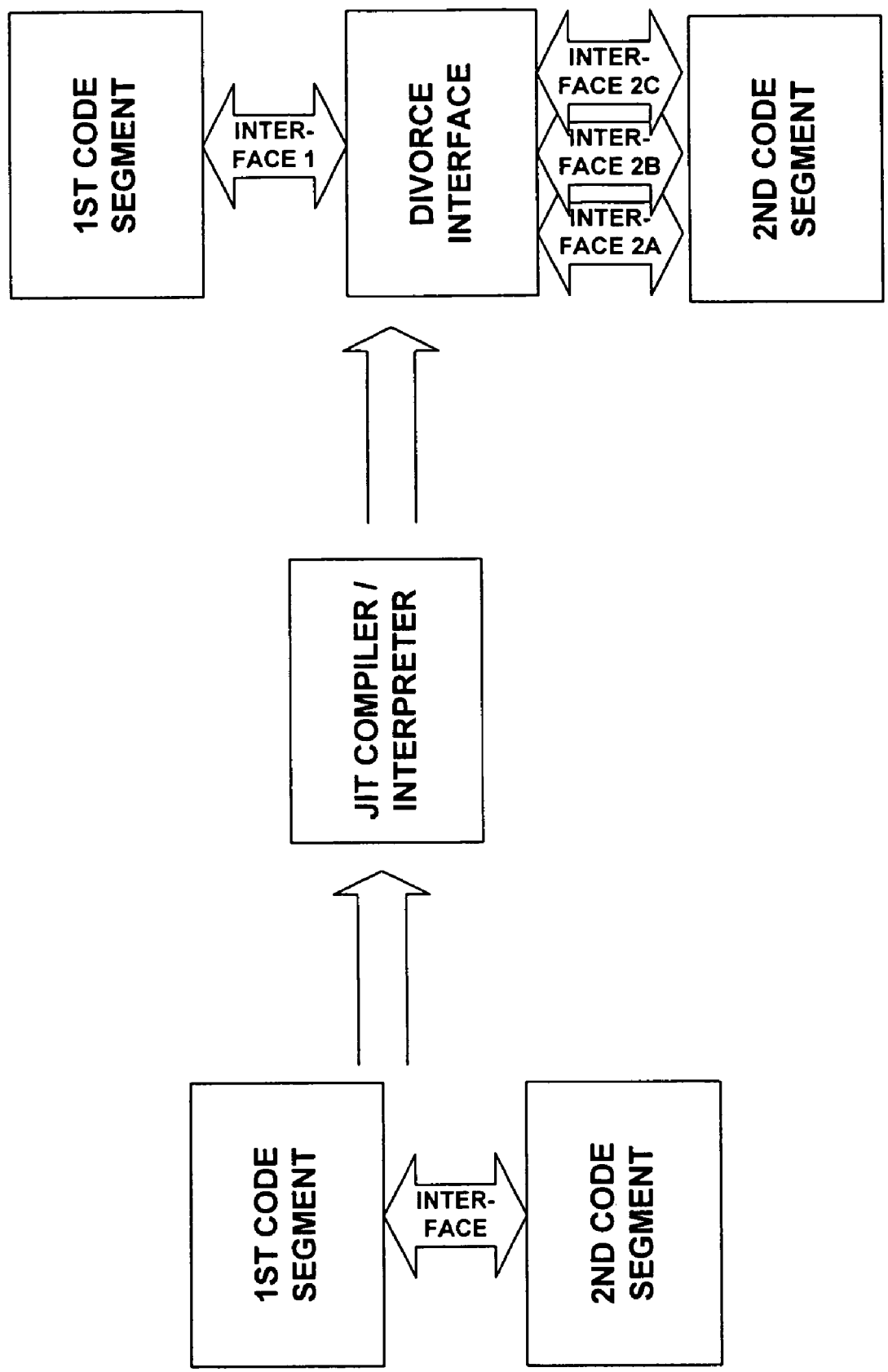
Figure 25B:
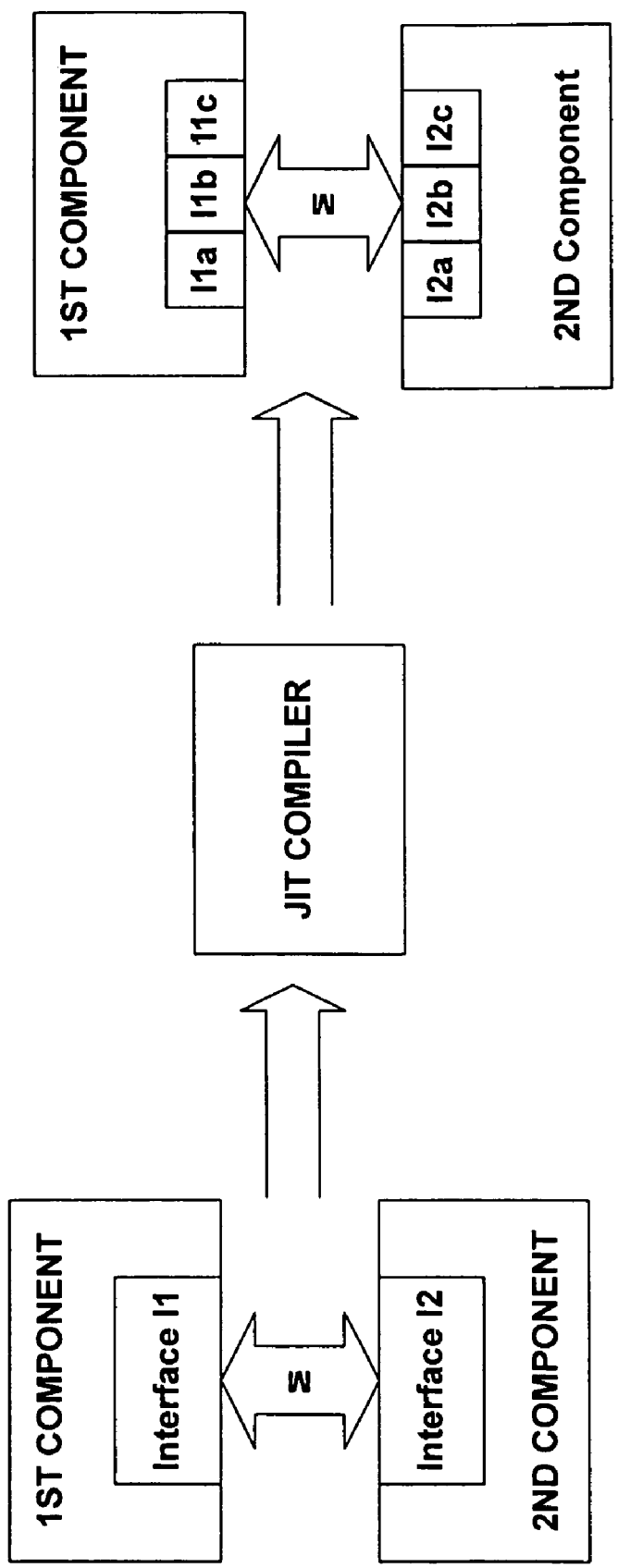

Yet another possible variant is to dynamically rewrite the code to replace the interface functionality with something else but which achieves the same overall result. For example, there may be a system in which a code segment presented in an intermediate language (e.g. Microsoft IL, Java ByteCode, etc.) is provided to a Just-in-Time (JIT) compiler or interpreter in an execution environment (such as that provided by the Net framework, the Java runtime environment, or other similar runtime type environments). The JIT compiler may be written so as to dynamically convert the communications from the $1^{st}$ Code Segment to the $2^{nd}$ Code Segment, i.e., to conform them to a different interface as may be required by the $2^{nd}$ Code Segment (either the original or a different $2^{nd}$ Code Segment). This is depicted in FIGS. 25A and 25B. As can be seen in FIG. 25A, this approach is similar to the Divorce scenario described above. It might be done, e.g., where an installed base of applications are designed to communicate with an operating system in accordance with an Interface1 protocol, but then the operating system is changed to use a different interface. The JIT Compiler could be used to conform the communications on the fly from the installed-base applications to the new interface of the operating system. As depicted in FIG. 25B, this approach of dynamically rewriting the interface(s) may be applied to dynamically factor, or otherwise alter the interface(s) as well.

It is also noted that the above-described scenarios for achieving the same or similar result as an interface via alternative embodiments may also be combined in various ways, serially and/or in parallel, or with other intervening code. Thus, the alternative embodiments presented above are not mutually exclusive and may be mixed, matched and combined to produce the same or equivalent scenarios to the generic scenarios presented in FIGS. 20A and 20B. It is also noted that, as with most programming constructs, there are other similar ways of achieving the same or similar functionality of an interface which may not be described herein, but nonetheless are represented by the spirit and scope of the invention, i.e., it is noted that it is at least partly the functionality represented by, and the advantageous results enabled by, an interface that underlie the value of an interface.

There are thus multiple ways of implementing the present invention, e.g., an appropriate API, tool kit, driver code, operating system, control, standalone or downloadable software object, etc. which enables applications and services to use the systems and methods for compressing and decompressing markup data in accordance with the invention. The invention contemplates the use of the invention from the standpoint of an API (or other software object), as well a software or hardware object that receives, transmits or processes compressed data in accordance with the invention. Thus, various implementations of the invention described herein may have aspects that are wholly in hardware, partly in hardware and partly in software, as well as in software.

As mentioned above, while exemplary embodiments of the present invention have been described in connection with various computing devices and network architectures, the underlying concepts may be applied to any computing device or system in which it is desirable to compress, decompress, transmit, send and/or update markup data. For instance, the algorithm(s) and hardware implementations of the invention may be applied to the operating system of a computing device, provided as a separate object on the device, as part of another object as a reusable control, as a downloadable object from a server, as a "middle man" between a device or object and the network, as a distributed object, as hardware, in memory, a combination of any of the foregoing, etc. While exemplary programming languages, names and examples are chosen herein as representative of various choices, these languages, names and examples are not intended to be limiting. One of ordinary skill in the art will appreciate that there are numerous ways of providing object code and nomenclature that achieves the same, similar or equivalent functionality achieved by the various embodiments of the invention.

As mentioned, the various techniques described herein may be implemented in connection with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device generally includes a processor, a storage medium readable by the processor (including volatile and non-volatile memory and/or storage elements), at least one input device, and at least one output device. One or more programs that may implement or utilize the compression techniques of the present invention, e.g., through the use of a data processing API, reusable controls, or the like, are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, etc., the machine becomes an apparatus for practicing the invention. When implemented on a general-purpose processor, the program code combines with the processor to provide a unique apparatus that operates to invoke the functionality of the present invention. Additionally, any storage techniques used in connection with the present invention may invariably be a combination of hardware and software.

While the present invention has been described in connection with the preferred embodiments of the various figures, it is to be understood that other similar embodiments may be used or modifications and additions may be made to the described embodiment for performing the same function of the present invention without deviating therefrom. For example, while exemplary network environments of the invention are described in the context of a networked environment, such as a peer to peer networked environment, one skilled in the art will recognize that the present invention is not limited thereto, and that the methods, as described in the present application may apply to any computing device or environment, such as a gaming console, handheld computer, portable computer, etc., whether wired or wireless, and may be applied to any number of such computing devices connected via a communications network, and interacting across the network. Furthermore, it should be emphasized that a variety of computer platforms, including handheld device operating systems and other application specific operating systems are contemplated, especially as the number of wireless networked devices continues to proliferate. Cell phones and personal devices of all sorts will be exchanging markup data more than ever, and thus will be especially good vehicles for applying the techniques of the invention.

While exemplary embodiments refer to utilizing the present invention in the context of particular programming language constructs, the invention is not so limited, but rather may be implemented in any language. For instance, while exemplary embodiments are described in the context of XML, the systems and methods of the invention may be practiced with any declarative, or markup language, wherein a schema defines a format for data and the schema may be abstracted to a FSM in accordance with the techniques described herein. Still further, the present invention may be implemented in or across a plurality of processing chips or devices, and storage may similarly be effected across a plurality of devices. Therefore, the present invention should not be limited to any single embodiment, but rather should be construed in breadth and scope in accordance with the appended claims.

What is claimed:

1. A computer-implemented method for generating an overall finite state machine and rule file for aiding in the compressing or decompressing of markup language data of a markup language schema by taking into account the structure of the markup language schema, comprising:

for elements of the markup language schema retrievable from a first machine, defining an overall finite state machine that represents all of the elements and the information of the markup language schema, the information of the markup language schema defining the elements that can appear in a document, the elements that can be child elements, the sequence that child elements can appear in a document, the number elements that can be included, and data types for elements;

compressing a data file using the overall finite state machine;

reducing said overall finite state machine to a rule file, which may be used to reconstruct the overall finite state machine, said rule file comprising a plurality of rule nodes, each rule node describing a finite state machine for a global XML element and comprising a plurality of state sub-elements describing state information of the global XML element; and transmitting said rule file to a second machine;

reconstructing the overall finite state machine from said rule file on the second machine;

decompressing the data file using the reconstructed overall finite state machine on the second machine.

2. A computer-implemented method according to claim 1, wherein said defining includes, for each element of the markup language schema, defining an individual finite state machine that represents the element and based on the individual finite state machines representing the elements, defining the overall finite state machine.

3. A computer-implemented method according to claim 2, wherein said defining the individual finite state machine includes defining the individual finite state machine in a recursive manner.

4. A computer-implemented method according to claim 1, further comprising compacting the overall finite state machine by removing any redundant states in the overall finite state machine.

5. A computer-implemented method according to claim 1, wherein said reducing includes serializing said overall finite state machine to the rule file.

6. A computer-implemented method according to claim 1, wherein the markup language data is extensible markup language (XML) data.

7. A computer-implemented method according to claim 1, wherein said overall finite state machine comprises states such that given a state, based on an input/event to the overall finite state machine, a move is made to a specific next state defined by the overall finite state machine optionally including the generation of some output.

8. A computer readable storage medium comprising computer executable instructions for implementing an application programming interface, said executable instructions for performing the following:

for elements of a markup language schema retrievable from a first machine, defining an overall finite state machine that represents all of the elements and the information of the markup language schema, the information of the markup language schema defining the elements that can appear in a document, the elements that can be child elements, the sequence that child elements can appear in a document, the number elements that can be included, and data types for elements;

compressing a data file using the overall finite state machine;

reducing said overall finite state machine to a rule file, which may be used to reconstruct the overall finite state machine, the rule file comprising a plurality of rule nodes, each rule node describing a finite state machine for a global XML element and comprising a plurality of state sub-elements describing state information of the global XML element; and transmitting said rule file to a second machine;

reconstructing the overall finite state machine from said rule file on the second machine;

decompressing the data file using the reconstructed overall finite state machine on the second machine.

9. A computer readable storage medium comprising executable instructions for performing the following:

for elements of a markup language schema retrievable from a first machine, defining an overall finite state machine that represents all of the elements and the information of the markup language schema, the information of the markup language schema defining the elements that can appear in a document, the elements that can be child elements, the sequence that child elements can appear in a document, the number elements that can be included, and data types for elements;

compressing a data file using the overall finite state machine;

reducing said overall finite state machine to a rule file, which may be used to reconstruct the overall finite state machine, the rule file comprising a plurality of rule nodes, each rule node describing a finite state machine for a global XML element and comprising a plurality of state sub-elements describing state information of the global XML element; and transmitting said rule file to a second machine; reconstructing the overall finite state machine from said rule file on the second machine;

decompressing the data file using the reconstructed overall finite state machine on the second machine.

10. A computing device, comprising:

a computing processor;

computing memory communicatively coupled to said computing processor, said computing memory having executable instructions therein for performing the following:

for elements of a markup language schema retrievable from a first machine, defining an overall finite state machine that represents all of the elements and the information of the markup language schema, the information of the markup language schema defining the elements that can appear in a document, the elements that can be child elements, the sequence that child elements can appear in a document, the number elements that can be included, and data types for elements;

compressing a data file using the overall finite state machine;

reducing said overall finite state machine to a rule file, which may be used to reconstruct the overall finite state machine, the rule file comprising a plurality of rule nodes, each rule node describing a finite state machine for a global XML element and comprising a plurality of state sub-elements describing state information of the global XML element; and transmitting said rule file to a second machine;

reconstructing the overall finite state machine from said rule file on the second machine;

decompressing the data file using the reconstructed overall finite state machine on the second machine.

11. A computer-implemented method for compressing markup language data by taking into account the structure of the underlying markup language schema, comprising:

instantiating in memory of a first machine an overall finite state machine that represents all of the elements of the markup language schema and the information of the markup language schema, the information of the markup language schema defining the elements that can appear in a document, the elements that can be child elements, the sequence that child elements can appear in a document, the number elements that can be included, and data types for elements;

compressing markup language data using the overall finite state machine;

using the overall finite state machine to discern structural information about the markup language data, separating the markup language data into at least one content portion representing variable content and at least one structure portion representing fixed aspects that do not change as the markup language data changes;

transmitting a rule file, constructed from the overall finite state machine, to a second machine, said rule file comprising a plurality of rule nodes, each rule node describing a finite state machine for a global XML element and comprising a plurality of state sub-elements describing state information of the global XML element, each rule node comprising at least a declaration element comprising a stream sub-element and a counter sub-element, the stream sub-element comprising content with similar types, the counter sub-element comprising statistical information regarding the stream sub-element; and transmitting said at least one content portion and said at least one structure portion, such that said overall finite state machine can be reconstructed from the rule file on the second machine and such that said markup language data can be decompressed.

12. A computer-implemented method according to claim 11, wherein said markup language data is extensible markup language (XML) data.

13. A computer-implemented method according to claim 11, wherein said instantiating includes compacting the overall finite state machine by removing any redundant states in the overall finite state machine.

14. A computer-implemented method according to claim 11, further including serializing said overall finite state machine to the rule file prior to said instantiating.

15. A computing device comprising:

a computing processor;

computing memory communicatively coupled to said computing processor, said computing memory having executable instructions therein for performing the following:

instantiating in memory of a first machine an overall finite state machine that represents all of elements of a markup language schema and the information of the markup language schema, the information of the markup language schema defining the elements that can appear in a document, the elements that can be child elements, the sequence that child elements can appear in a document, the number elements that can be included, and data types for elements;

compressing markup language data using the overall finite state machine;

using the overall finite state machine to discern structural information about the markup language data, separating the markup language data into at least one content portion representing variable content and at least one structure portion representing fixed aspects that do not change as the markup language data changes;

transmitting a rule file, constructed from the overall finite state machine, to a second machine, said rule file comprising a plurality of rule nodes, each rule node describing a finite state machine for a global XML element and comprising a plurality of state sub-elements describing state information of the global XML element, each rule node comprising at least a declaration element comprising a stream sub-element and a counter sub-element, the stream sub-element comprising content with similar types, the counter sub-element comprising statistical information regarding the stream sub-element; and transmitting said at least one content portion and said at least one structure portion, such that said overall finite state machine can be reconstructed from the rule file on the second machine and such that said markup language data can be decompressed.

16. A computer-implemented method for decompressing markup language data by taking into account the structure of the markup language schema, comprising:

receiving by a first machine a rule file, the rule file having been constructed from an overall finite state machine in memory of a second machine, the rule file comprising a plurality of rule nodes, each rule node describing a finite state machine for a global XML element and comprising a plurality of state sub-elements describing state information of the global XML element, and receiving the markup language data including at least one content portion representing variable content and at least one structure portion representing fixed aspects that do not change as the markup language data changes;

constructing and instantiating in memory of the first machine the overall finite state machine from the rule file; and decompressing said markup language data based on structural information discerned about the underlying markup language schema from the overall finite state machine, the markup language schema defining the elements that can appear in a document, the elements that can be child elements, the sequence that child elements can appear in a document, the number elements that can be included, and data types for elements.

17. A computer-implemented method according to claim 16, wherein said constructing and instantiating includes compacting the overall finite state machine by removing any redundant states in the overall finite state machine.

18. A computer-implemented method according to claim 16, wherein said receiving the rule file includes receiving at least one indication of an element and several state sub-elements describing state information of the at least one element.

19. A computer-implemented method according to claim 16, wherein said receiving the rule file includes receiving at least one stream, wherein each stream includes content having similar meaning or types.

20. A computing device comprising, a computing processor;

computing memory communicatively coupled to said computing processor, said computing memory having executable instructions therein for performing the following:

receiving by a first machine a rule file, the rule file having been constructed from an overall finite state machine in memory of a second machine, the rule file comprising a plurality of rule nodes, each rule node describing a finite state machine for a global XML element and comprising a plurality of state sub-elements describing state information of the global XML element, and receiving markup language data including at least one content portion representing variable content and at least one structure portion representing fixed aspects that do not change as the markup language data changes;

constructing and instantiating in memory of the first machine the overall finite state machine from the rule file; and decompressing said markup language data based on structural information discerned about the underlying markup language schema from the overall finite state machine, the markup language schema defining the elements that can appear in a document, the elements that can be child elements, the sequence that child elements can appear in a document, the number elements that can be included, and data types for elements.

* * * * *